United States Patent
Herrmann et al.

(10) Patent No.: US 6,956,487 B2
(45) Date of Patent: Oct. 18, 2005

(54) BATTERY CHARGING STATUS INDICATION CIRCUIT

(75) Inventors: John E. Herrmann, Sugar Hill, GA (US); Michael Geren, Suwanee, GA (US)

(73) Assignee: Motorola, Inc., Schaumburg, IL (US)

( * ) Notice: Subject to any disclaimer, the term of this patent is extended or adjusted under 35 U.S.C. 154(b) by 434 days.

(21) Appl. No.: 10/226,932

(22) Filed: Aug. 23, 2002

(65) Prior Publication Data

US 2004/0036620 A1 Feb. 26, 2004

(51) Int. Cl.[7] .................... H01M 10/44; H01M 10/46; H02J 7/00; H02J 7/10
(52) U.S. Cl. ............... 340/636.12; 340/636.13; 340/636.2; 340/636.15; 320/125; 320/131; 320/132; 320/134; 320/135; 320/137; 320/145; 324/433; 324/427
(58) Field of Search ............ 340/636.12, 636.13, 340/636.15, 636.2, 636; 320/125–146, 14–44, 13; 324/427–433

(56) References Cited

U.S. PATENT DOCUMENTS

| | | | |
|---|---|---|---|
| 4,020,414 A | * 4/1977 | Paredes ..................... 324/433 |
| 4,163,186 A | 7/1979 | Haley | |
| 4,467,265 A | * 8/1984 | Hierholzer, Jr. ............. 320/146 |
| 4,558,281 A | 12/1985 | Codd et al. | |
| 4,609,860 A | * 9/1986 | Fasen .......................... 320/131 |
| 5,055,763 A | * 10/1991 | Johnson et al. ............. 320/125 |
| 5,633,592 A | 5/1997 | Lang | |
| 5,698,965 A | 12/1997 | York | |
| 5,708,348 A | * 1/1998 | Frey et al. ................... 320/145 |
| 5,973,497 A | 10/1999 | Bergk | |
| 6,252,511 B1 | 6/2001 | Mondshine | |
| 6,304,060 B1 | * 10/2001 | Dernehl ...................... 320/132 |

* cited by examiner

*Primary Examiner*—Jeffery Hofsass
*Assistant Examiner*—Lam Pham
(74) *Attorney, Agent, or Firm*—Philip H. Burrus, IV

(57) ABSTRACT

This invention includes a circuit for displaying charge status to a user. The circuit includes circuitry for comparing a supply or reference voltage to a cell voltage, circuitry for sensing charging current and circuitry for displaying at least one of three charging states to a user. The circuit compares the supply or reference voltage to the cell voltage while sensing current. If the difference between the supply or reference voltage is great, and current is small, the circuit indicates a trickle charging mode. If the charging current is large, the circuit indicates rapid charge. If the difference between the supply or reference voltage is small, and the current is small, the circuit indicates a top off mode. The circuit preferably includes a plurality of comparators for both sensing and comparing the voltages and currents. A pair of light emitting diodes preferably indicates the state of charge to the user.

11 Claims, 2 Drawing Sheets

BATTERY CHARGING STATUS INDICATION CIRCUIT

BACKGROUND

1. Technical Field

This invention relates generally to charging circuits for rechargeable batteries, and more particularly to a circuit and method for differentiating between different charging states and indicating a particular charging state to a user.

2. Background Art

People today rely upon portable electronic devices more than ever. For example, it has become quite commonplace for people of all ages and walks of life to carry cellular telephones everywhere they go. Such devices rely upon rechargeable batteries for their portability. These batteries reliably provide power to the product until their stored energy is depleted. They may then be recharged and used again.

In today's hustle and bustle world, people are often in a hurry to charge their batteries. For instance, they may be planning an outing when they find that their battery is dead. Thus, they insert the device into a battery charger for a quick charge prior to beginning their journey. Just as little Johnny, when hungry, may ask, "When will dinner be ready?", these users often ask, "When will the darned battery be charged?"

It is therefore necessary for the charger to provide the user with some form of charging status while the battery is being charged. Is the battery in a warm-up trickle mode? Is the battery in a rapidly charging mode? Is the battery almost full and in a top-off mode? It is impossible for the user to know without some form of charge status information from the charger.

Many types of charging status indicators are known in the art. For example, U.S. Pat. No. 4,558,218, issued to Codd et al., recites one such charge status indicator. In the Codd indicator, a microcomputer monitors battery voltage, current and temperature and then calculates how much charge has been delivered to or taken from the battery. While this system works, it is expensive because it includes a microcomputer. Many portable electronic devices, like cell phones, are becoming commodity items as their cost is rapidly dropping. Manufacturers can barely afford to include expensive microcomputers in the phone itself, much less a charger.

There is thus a need for an improved, low-cost battery charge status indicator circuit.

DETAILED DESCRIPTION OF THE INVENTION

Figure 1:
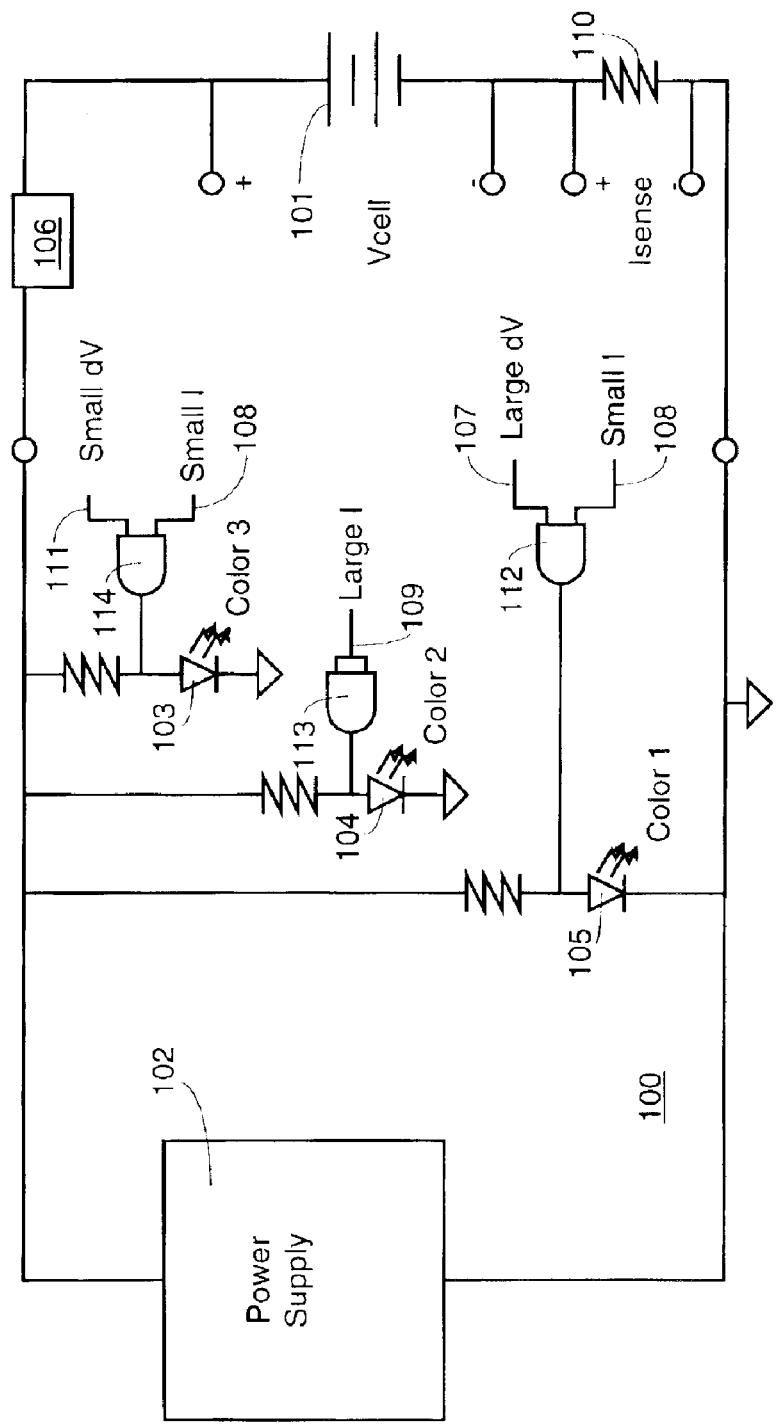
FIG. 1 illustrates a general embodiment of a low-cost charge status indication circuit in accordance with the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Referring now to FIG. 1, illustrated therein is a general embodiment of a low-cost charge status indication circuit 100 in accordance with the invention. Roughly speaking, the circuit 100 compares the voltage of the battery cell 101 to the voltage of the power supply 102. After making this comparison, the circuit 100 looks at the current. The circuit 100 then indicates to the user by way of light-emitting diodes (LEDs) 103–105 that the charger is in one of at least three charging states. These charging states are preferably trickle, rapid or top-off.

By way of background, it is a common misconception that battery charging is accomplished by simply "dumping" current into a rechargeable cell. In reality, the charging must be done in stages. As an example, for a single cell lithium battery there is an optimum window between 2.5 V and 4.0 V for charging. Within this window, the battery can be charged with a high current. This is known as rapid charge.

When rechargeable cells are charged, the voltage of the cell rises. Lithium-based rechargeable cells typically have a maximum termination voltage of 4.1 or 4.2 volts. This means that if a lithium-based battery is charged beyond the termination voltage—known as an "overvoltage condition"—the reliability of the cell may be compromised. Most lithium batteries include a protection circuit that senses the voltage of the cell and terminates charging by opening a switch in the battery when the cell reaches the proper termination voltage. So as not to overshoot this termination voltage, the charging current is reduced between ~4.0 and 4.2 volts. This is analogous to a VCR rewind a tape slowing down just prior to reaching the start to avoid breaking the tape. This low-current state is called top-off charge.

There is another condition however, known as an "undervoltage condition", that occurs when the cell voltage drops below it's recommended operating point. For a typical lithium-ion cell, this voltage is about 2.5 volts. When the voltage drops below this level, possibly due to over discharge, cell manufacturers suggest that rapid charging may damage the cell by inhibiting the storage capacity. To prevent performance loss, therefore, the battery must be slowly charged until it reaches the minimum operational threshold. The slow charging current is called a trickle charge.

Refer again to FIG. 1. The circuit 100, in a general form, distinguishes between the three charging states by looking at charging current and the difference between the power supply 102 voltage and the battery cell 101 voltage. The battery pack includes a charging/protection circuit 106 to ensure that the battery is not overcharged. The protection circuit 106 may further include a trickle charging circuit that forces the cell 101 into trickle charge when the cell voltage is below the optimal charging window. Such a protection circuit is recited in copending application Ser. No. 10/185, 095, filed Jun. 29, 2002, entitled "Thermally Limited Battery Protection and Charging Circuit", which is incorporated herein by reference.

The circuit 100 then works in tandem with the protection circuit 106 to determine the present state of charge. When there is a large difference between the voltages of the power supply 102 and the battery cell 101, and the charging current is small, the circuit 100 presumes that the battery is in an undervoltage condition, with charging current limited by the protection circuit 106. As the Small dV input 107 and the Small current (I) input 108 are both true, AND gate 112 actuates LED 105 indicating that the charger is in a trickle charge mode.

When the charging current is high, the circuit 100 presumes rapid charge, as neither the trickle charge component of the protection circuit 106, nor the top-off current component is actuated. (Note that the rapid charge state is mutually exclusive with trickle and top-off, because in the latter two, charging current is limited.) In the rapid charge mode, the large I input 109 is true, AND gate 113 actuates LED 104, thereby indicating rapid charge.

Once the cell 101 becomes fully charged, either the protection circuit 106 or the internal impedance of the cell 101 causes a reduction in the charging current. The circuit 100 senses a small difference between the voltage of the power supply 102 and the voltage of the cell 101, as well as a small charging current. The circuit 100 presumes top-off mode. As the small dV input 111 and the small I input 108 are both true, AND gate 114 actuates LED 103, thereby indicating top-off charging mode.

Note that the current is sensed by way of a current sense resistor 110. Additionally, the voltages of the power supply 102 and battery cell 101 may be sensed in any of a number of conventional means, including the use of comparators, voltage references and the like.

Figure 2:
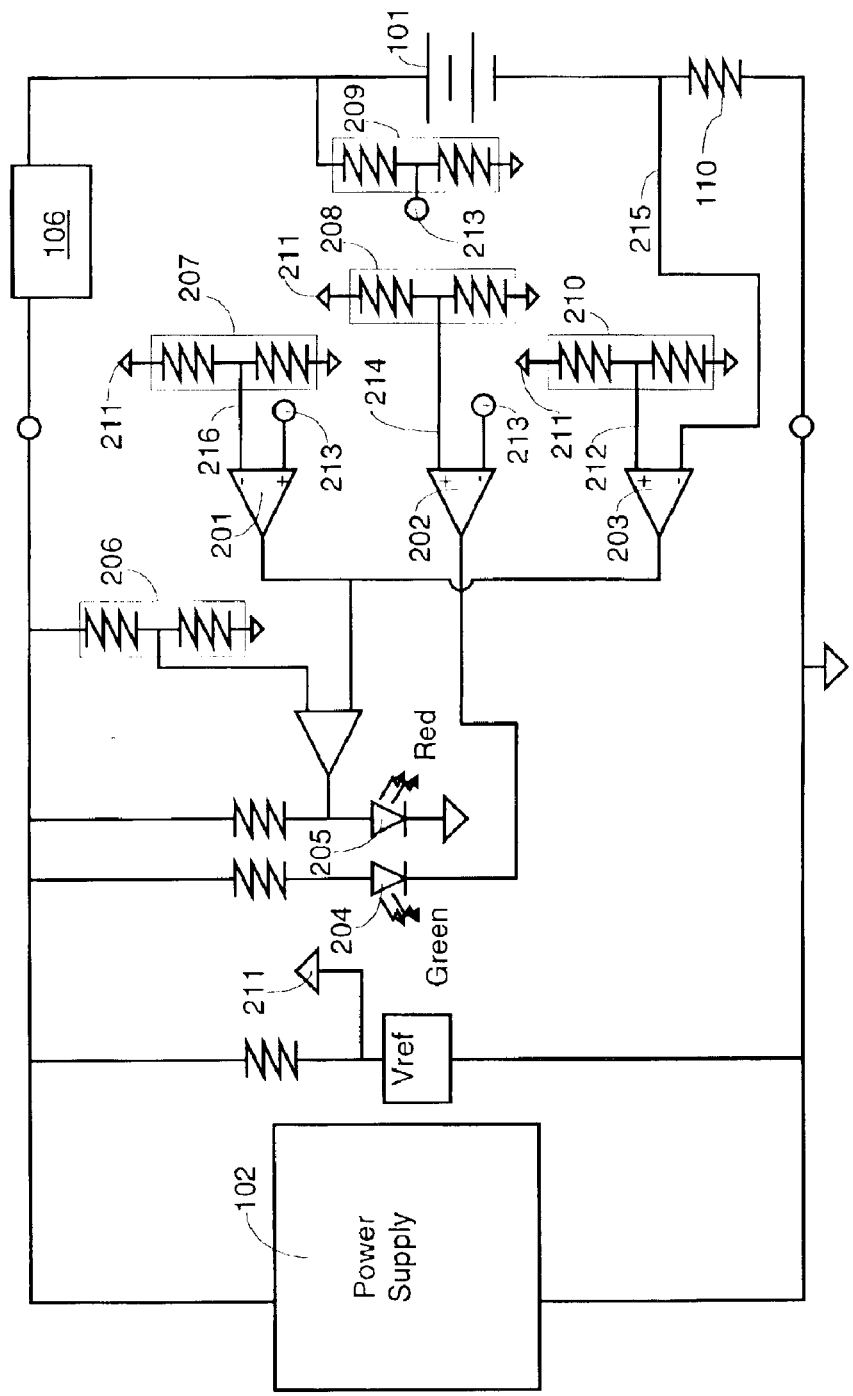
FIG. 2 illustrates one preferred embodiment of a circuit in accordance with the invention.

Referring now to FIG. 2, a preferred embodiment of a circuit in accordance with the invention is shown. Elements common with FIG. 1 include the cell 101, the current sense resistor 110, the protection circuit 106 and the power supply 102. In the FIG. 2, however, the AND gates have been replaced with comparators 201–203 to facilitate voltage and current sensing and comparison with a single component. Additionally, the three LEDs of FIG. 1 have been replaced with two: a green LED 204 and a red LED 205. Actuating both the green LED 204 and the red LED 205 simultaneously creates the third color, as a "yellowish" light results. Further, resistor dividers 206–210 have been added to scale the supply and cell voltages below the rails of the comparators 201–203, as well as to tailor the circuit to particular design criteria. A reference voltage has been added to keep the power supply 102 comparison voltage constant so that it may be used for multiple comparisons, although a resistor divider would work with less accuracy. The operation of the circuit is best explained state-by-state.

Trickle Mode: When the scaled cell voltage 213 is below the scaled reference voltage 216, comparator 201, which has an open-collector output, goes low causing the red LED 205 to come on. (This occurs regardless of the state of comparator 203.) If the scaled cell voltage 213 is below scaled reference voltage 214, the output of comparator 202 is in its high impedance state, causing the green LED 204 to go off. Thus, the sum LED output is red, thereby indicating trickle mode. (Note that the green LED 204 is driven exclusively by cell voltage. Thus, regardless of current, when the scaled cell voltage 213 is below scaled reference voltage 214, the green LED 204 is always off.)

Rapid Mode: When the current sense voltage 215 is above scaled reference voltage 212, comparator 203 goes low, causing the red LED 205 to come on, regardless of the state of comparator 201 due to the open collector outputs of each. If the scaled cell voltage 213 is also above scaled reference voltage 214, comparator 202 is low, thus causing the green LED 204 to come on. As the red LED 205 is on, and the green LED 204 is on, the net output is yellow, thereby indicating rapid charge.

Top-Off Mode: So long as the scaled cell voltage 213 stays above scaled reference voltage 214, the green LED 204 remains on. As the cell 101 nears full charge, the current tapers. When the current sense voltage 215 falls below scaled reference voltage 212, the output of comparator 203 becomes high impedance. If the scaled cell voltage 213 is above scaled reference voltage 216 at the same time, both comparator 201 and 203 are in high impedance states, thereby causing the red LED 205 to go off. As the red LED 205 is off, and the green LED 204 is on, the net output is green, thereby indicating top-off mode.

The truth table below offers a summary of the charging states and LED status:

TABLE 1

| Green LED | Red LED | Net Output | Charging State |
|---|---|---|---|
| OFF | ON | RED | Scaled cell voltage 213 below scaled reference voltages 214 and 216, regardless of current sense voltage 215 |
| ON | ON | YELLOW | Scaled cell voltage 213 above scaled reference voltage 214, AND current sense voltage 215 is above scaled reference voltage 212 |
| ON | OFF | GREEN | Scaled cell voltage 213 above scaled reference voltages 214 and 216, AND current sense voltage 215 is below scaled reference voltage 212 |

It will be clear to those of ordinary skill in the art that resistors of varying values may be employed in resistor dividers 206–210, thereby allowing the designer to tailor the circuit's operation to a particular type of combination of cells. Additionally, it will be clear that any number of LED indicators could be used to indicate with greater resolution the present charging state.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A charge status indication circuit comprising:
   a. a means for measuring a difference between a power supply voltage and a battery cell voltage;
   b. a means for comparing a current to a current threshold; and
   c. a means of indicating one of at least three charging states to a user.

2. The circuit of claim 1, wherein the first state occurs when the difference between the power supply voltage and the battery cell voltage is below a predetermined threshold.

3. The circuit of claim 2, wherein the first state occurs when:

a. the difference between the power supply voltage and the battery cell voltage is below the predetermined threshold; and b. the current is below the current threshold.

4. The circuit of claim 2, wherein the second state occurs when the current exceeds the current threshold.

5. The circuit of claim 4, wherein the third state occurs when:

a. the difference between the power supply voltage and the battery cell voltage exceeds the predetermined threshold; and b. the current is below the current threshold.

6. The circuit of claim 1, wherein:

a. the means for measuring a difference between a power supply voltage and a battery cell voltage and the a means for comparing current to a current threshold comprise a plurality of comparators; and b. the means of indicating one of at least three states of charge to a user comprises at least two light emitting diodes coupled to the plurality of comparators;

wherein the at least two light emitting diodes are capable of being actuated by the plurality of comparators.

7. The circuit of claim 6, further comprising a plurality of reference voltages coupled to the plurality of comparators.

8. The circuit of claim 7, further comprising a cell voltage coupled to the plurality of comparators.

9. The circuit of claim 8, wherein when the cell voltage is less than a first reference voltage, a first light emitting diode is actuated.

10. The circuit of claim 9, wherein when the current is above the current threshold and the cell voltage is greater than the first reference voltage, a second light emitting diode is actuated.

11. The circuit of claim 10, wherein when the current is below the current threshold, and the cell voltage is above a second reference voltage, both the first and second light emitting diodes are actuated.

* * * * *